(12) United States Patent
Chuang et al.

(10) Patent No.: US 11,435,861 B2
(45) Date of Patent: Sep. 6, 2022

(54) TOUCH DIMMING DEVICE AND TOUCH DIMMING METHOD

(71) Applicant: TPK Touch Solutions (Xiamen) Inc., Fujian (CN)

(72) Inventors: Chihcheng Chuang, Hsinchu County (TW); Shangyu Lin, Hsinchu County (TW); Tai Shih Cheng, Taipei (TW)

(73) Assignee: TPK Touch Solutions (Xiamen) Inc., Fujian (CN)

(*) Notice: Subject to any disclaimer, the term of this patent is extended or adjusted under 35 U.S.C. 154(b) by 0 days.

(21) Appl. No.: 17/088,959

(22) Filed: Nov. 4, 2020

(65) Prior Publication Data

US 2022/0137749 A1    May 5, 2022

(51) Int. Cl.
| | |
|---|---|
| *G06F 3/044* | (2006.01) |
| *G02F 1/23* | (2006.01) |
| *G02F 1/1333* | (2006.01) |
| *G06F 3/041* | (2006.01) |

(52) U.S. Cl.
CPC ........ *G06F 3/0445* (2019.05); *G02F 1/13338* (2013.01); *G02F 1/23* (2013.01); *G06F 3/0412* (2013.01)

(58) Field of Classification Search
CPC ........ G06F 3/0445; G06F 3/041–0412; G09G 3/36–3696
See application file for complete search history.

(56) References Cited

U.S. PATENT DOCUMENTS

| | | | |
|---|---|---|---|
| 5,929,834 | A | 7/1999 | Inoue et al. |
| 2011/0169751 | A1 | 7/2011 | Kim et al. |
| 2011/0255046 | A1* | 10/2011 | Kurokawa ............. G06F 3/042 349/140 |
| 2016/0041664 | A1* | 2/2016 | Qin ..................... G06F 3/04166 345/173 |
| 2017/0115786 | A1* | 4/2017 | Kimura ............ G02F 1/134363 |
| 2018/0232095 | A1* | 8/2018 | Ikeda .................. G06F 3/0412 |

FOREIGN PATENT DOCUMENTS

| | | |
|---|---|---|
| JP | 2007139817 A | 6/2007 |
| JP | 3202630 U | 2/2016 |
| JP | 2019101713 A | 6/2019 |
| TW | 201324468 A1 | 6/2013 |
| TW | M606238 U | 1/2021 |
| WO | 2016006081 A1 | 1/2016 |

* cited by examiner

*Primary Examiner* — Sanjiv D. Patel
(74) *Attorney, Agent, or Firm* — Cooper Legal Group, LLC

(57) ABSTRACT

The present disclosure relates to a touch dimming device including a touch panel and an active color changing film. The touch panel includes a first electrode and a second electrode to perform touch detection according to a coupling capacitance between the first electrode and the second electrode. The active color changing film includes a third electrode and a polymer layer. The polymer layer is configured to change a light transmittance of the active color changing film according to a voltage difference between the second electrode and the third electrode.

20 Claims, 5 Drawing Sheets

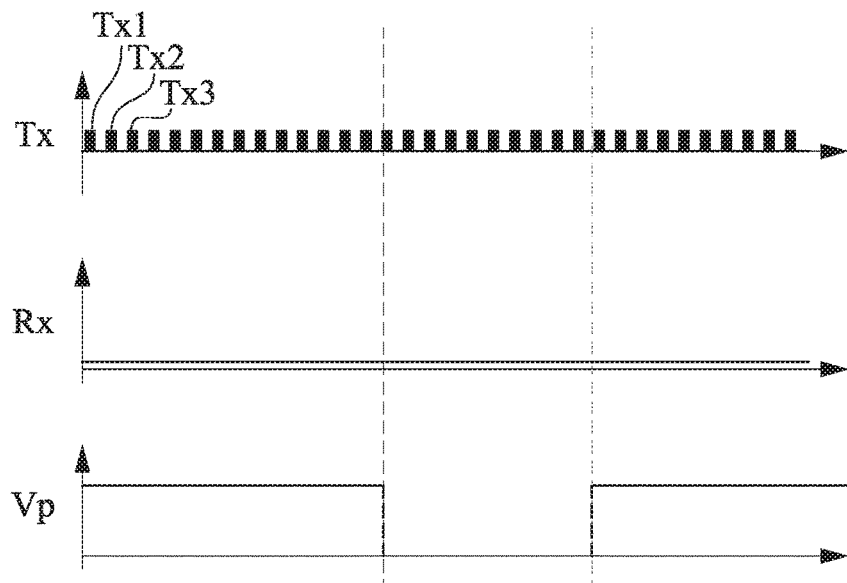
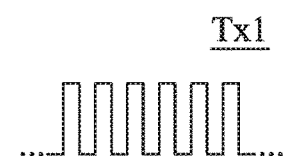
Fig. 2B
Fig. 2A
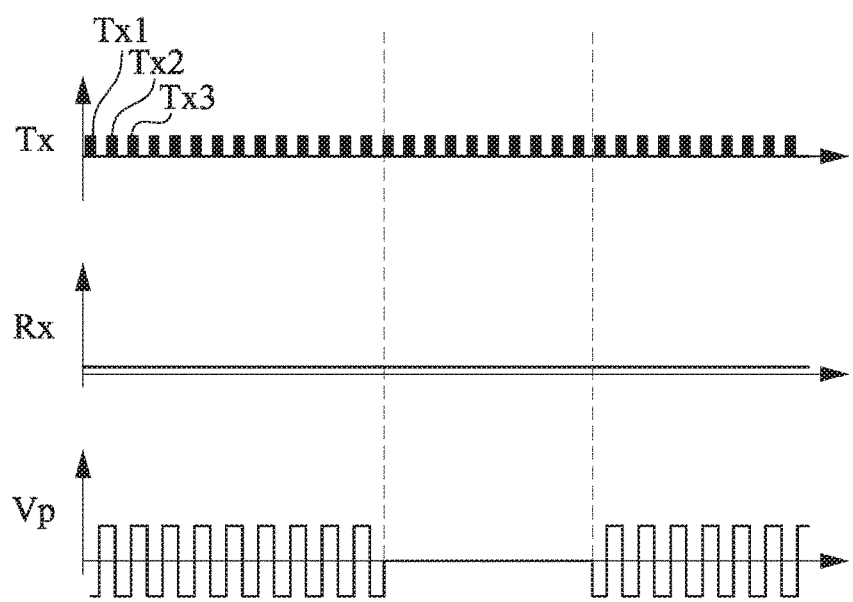
Fig. 3

TOUCH DIMMING DEVICE AND TOUCH DIMMING METHOD

BACKGROUND

Technical Field

The present disclosure relates to a touch dimming device, in particular to a device configured to electrically change the light transmittance and that has a touch function.

Description of Related Art

The transparent display industry is one of many rapidly developing industries in recent years, and transparent displays are widely used in many fields, such as monitor systems, vehicle systems, augmented reality/visual reality (AR/VR) devices, and projection devices. Due to the increasing demand for transparent displays in the market, the combination of transparent displays with other devices has gradually attracted attention. However, when the transparent display is combined with other devices, balancing the cost, volume, and performance of the combined device is a major issue at present.

SUMMARY

One aspect of the present disclosure is a touch dimming device, including a touch panel and an active color changing film. The touch panel includes a first electrode and a second electrode. The touch panel is configured to perform touch detection according to a coupling capacitance between the first electrode and the second electrode. The active color changing film includes a third electrode and a polymer layer. The polymer layer is configured to change a light transmittance of the active color changing film according to a voltage difference between the second electrode and the third electrode.

Another aspect of the present disclosure is a touch dimming method. The touch dimming method includes, during a touch period, providing a driving voltage to a first electrode and receiving a sensing voltage from a second electrode. The touch dimming method includes, during the touch period, detecting a coupling capacitance between the first electrode and the second electrode. The touch dimming method includes during a dimming period, providing a dimming voltage to a third electrode, stopping providing the driving voltage to the first electrode, and stopping receiving the sensing voltage from the second electrode, so that an active color changing film changes a light transmittance of the active color changing film according to a voltage difference between the second electrode and the third electrode.

Another aspect of the present disclosure is a touch dimming method. The touch dimming method includes providing a driving voltage to a first electrode and receiving a sensing voltage from a second electrode. The touch dimming method includes detecting a coupling capacitance between the first electrode and the second electrode. The touch dimming method includes providing a dimming voltage to a third electrode, so that an active color changing film changes a light transmittance of the active color changing film according to a voltage difference between the second electrode and the third electrode. The touch dimming method includes, when stopping providing the dimming voltage to the third electrode, continuously providing the driving voltage to the first electrode and continuously receiving the sensing voltage from the second electrode.

It is to be understood that both the foregoing general description and the following detailed description are by way of examples and are intended to provide further explanation of the disclosure as claimed.

BRIEF DESCRIPTION OF THE DRAWINGS

The present disclosure can be more fully understood by reading the following detailed description of the embodiments, with reference made to the accompanying drawings as follows.

FIG. 2A is a waveform of the touch dimming device in some embodiments of the present disclosure.

FIG. 2B is waveform of a scanning signal in some embodiments of the present disclosure.

FIG. 3 is a waveform of the touch dimming device in some embodiments of the present disclosure.

DETAILED DESCRIPTION

Although embodiments are described below in detail with the accompanying drawings, the embodiments are not provided to limit the scope of the present disclosure. Moreover, the operation of the described structure is not for limiting the order of implementation. Any device with equivalent functions that is produced from a structure formed by a recombination of elements is covered by the scope of the present disclosure. Drawings are for the purpose of illustration only and are not plotted in accordance with the original size.

It will be understood that when an element is referred to as being "connected to" or "coupled to" another element, it can be directly connected or coupled to the other element or intervening elements may be present. In contrast, when an element is referred to as being "directly connected" or "directly coupled" another element, there are no intervening elements present. As used herein, the term "and/or" includes any and all combinations of one or more of the associated listed items.

Figure 1:
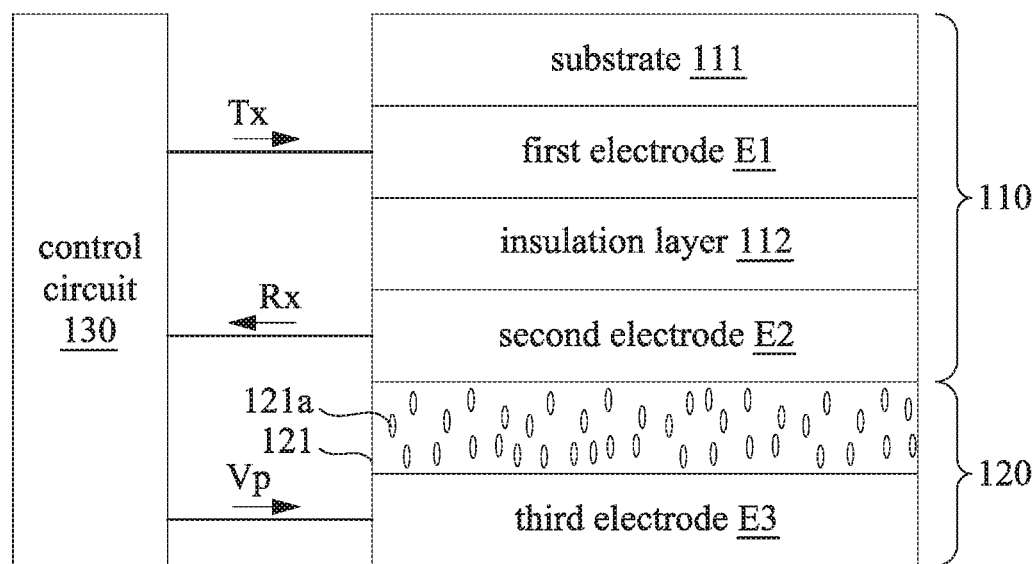
FIG. 1 is a schematic diagram of a touch dimming device in some embodiments of the present disclosure.

FIG. 1 is a schematic diagram of a touch dimming device 100 in some embodiments of the present disclosure. The touch dimming device 100 includes a touch panel 110 and an active color changing film 120. The touch panel 110 includes a first electrode E1 and a second electrode E2, so that the touch panel 110 is configured to have a coupling capacitance between the first electrode E1 and the second electrode E2 to perform touch detection.

Specifically, the first electrode E1 (or the second electrode E2) includes multiple sensing electrodes. A predetermined interval is formed between the sensing electrodes to detect the touch of a hand of a user and to identify the corresponding coordinates on the touch panel 110 corresponding to the touch. The structure of the touch panel 110 is not limited to that shown in FIG. 1. Since those skilled in the art can understand the structure and operation of the touch panel 110, it will not be repeated here.

FIG. 2A is a waveform of the touch dimming device 100 in some embodiments of the present disclosure. In one embodiment, the first electrode E1 is configured to receive a driving voltage Tx (e.g., 3V-40V), and the second electrode E2 is configured to receive a sensing voltage Rx (e.g., 1V-3V). The driving voltage Tx includes multiple scanning signals Tx1, Tx2, and Tx3. If each of the scanning signals Tx1, Tx2, and Tx3 is regard as a pulse, the frequency of the driving voltage Tx is between 30 Hz and 1000 Hz. In some embodiments, the frequency of the driving voltage Tx is between 100 Hz and 150 Hz. The sensing voltage Rx is maintained at a low potential in the touch panel 110, and a voltage value of the sensing voltage Rx can be between 1V-3V.

In addition, referring to FIG. 2B, in one embodiment, each of the scanning signals Tx1, Tx2, and Tx3 includes multiple pulse waves. The frequency of these pulse waves is between 10,000 Hz and 500,000 Hz. That is, the frequency of each of the scanning signals Tx1, Tx2, and Tx3 is between 10,000 Hz and 500,000 Hz.

As shown in FIG. 1, the active color changing film 120 includes a third electrode E3 and a polymer layer 121. The polymer layer 121 is arranged between the second electrode E2 and the third electrode E3 and is configured to change the light transmittance of the active color changing film 120 according to a voltage difference between the second electrode E2 and the third electrode E3. In some embodiments, the active color changing film 120 receives a dimming voltage Vp through the third electrode E3. The active color changing film 120 is further configured to drive and change a direction of the liquid crystal particles 121a of the polymer layer 121 according to the voltage difference between the dimming voltage Vp and the sensing voltage Rx, so that the light transmittance of the active color changing film 120 will be changed.

As shown in the figure, the touch panel 110 and the active color changing film 120 share the second electrode E2. The touch panel 110 performs touch detection according to the coupling capacitance between the first electrode E1 and the second electrode E2. The active color changing film 120 is driven according to the voltage difference between the dimming voltage Vp and the sensing voltage Rx, thereby changing the light transmittance of the active color changing film 120. In the present disclosure, since the touch panel 110 and the active color changing film 120 share the second electrode E2, the overall volume of the touch dimming device 100 can be reduced.

In addition, in some embodiments, the voltage value of the driving voltage Tx is between 3V-40V. The dimming voltage Vp is between 30V-60V. The voltage value of the dimming voltage Vp is much greater than the voltage value of the driving voltage Tx. In other embodiments, the ratio of the voltage value of the dimming voltage Vp to the voltage value of the driving voltage Tx may be between 1.2V-20V (e.g., the dimming voltage Vp is 40V, the driving voltage Tx is 33.3V, or the dimming voltage Vp is 60V, and the driving voltage Tx is 3V). In the case where the voltage value of the dimming voltage Vp and the voltage value of the driving voltage Tx have a significant difference, the driving voltage Tx will not affect the voltage difference on both sides of the active color changing film 120 (i.e., the voltage difference between the second electrode E2 and the third electrode E3), so there is no flicker phenomenon. Alternatively stated, the driving of the active color changing film 120 is not interfered with by the driving voltage Tx.

Specifically, the touch panel 110 further includes a substrate 111 and an insulation layer 112. The substrate 111 is made of a transparent material, and the insulation layer 112 is arranged between the first electrode E1 and the second electrode E2 to form the coupling capacitor (including the first electrode E1, the insulation layer 112, and the second electrode E2).

In one embodiment, the touch dimming device 100 further includes a control circuit 130. The control circuit 130 is electrically connected to the touch panel 110 and the active color changing film 120. The control circuit 130 is configured to provide the driving voltage Tx and the dimming voltage Vp and is configured to receive the sensing voltage Rx. The control circuit 130 is configured to perform touch detection according to the change of the sensing voltage Rx and to adjust the dimming voltage Vp to control the light transmittance of the active color changing film 120.

In some embodiments, the polymer layer 121 includes multiple liquid crystal particles 121a (e.g., spherical or elliptical particles) and rotates with the voltage difference between the second electrode E2 and the third electrode E3 to adjust the light transmittance of the active color changing film 120. In one embodiment, the liquid crystal particles 121a are dispersed on a polymer film. A polymer matrix in the polymer film is made up of many monomer molecules connected to each other. Each monomer must be able to bond more than two monomer molecules to form a continuous, long chain, and the structures of polymers formed by bonding different monomers are also different. Liquid crystal and unpolymerized polymer monomers are mixed in an appropriate ratio and then triggered by the outside (e.g., light or heat), and the polymer monomers perform polymerization to form the polymer layer 121. In some embodiments, the above structure of the active color changing film 120 can be realized by a Polymer Dispersed Liquid Crystal (PDLC).

In some other embodiments, multiple liquid crystal particles 121a of the polymer layer 121 are distributed in a polymer network structure. That is, the polymer layer 121 can be implemented by a Polymer Network Liquid Crystal (PNLC). Since those skilled in the art can understand the operation principle of PNLC and PDLC, it will not be repeated here.

The active color changing film 120 shown in FIG. 1 is an optical material that changes the light transmittance according to the voltage difference. Since the active color changing film 120 is not used to present images, the active color changing film 120 does not need to include transistor switches in implementation.

Referring to FIG. 1 and FIG. 2A, in some embodiments, the touch dimming device 100 may operate in a first state and a second state. In the first state, the third electrode E3 receives the dimming voltage Vp, so that the active color changing film 120 maintains a high transmittance (e.g., PDLC), or the active color changing film 120 maintains a low transmittance (e.g., PNLC). In the second state, the third electrode E3 stops receiving the dimming voltage Vp, so that the active color changing film 120 switches and maintains low transmittance (e.g., PDLC), or the active color changing film 120 switches and maintains high transmittance (e.g., PNLC).

In the above embodiments, the dimming voltage Vp is a direct current (DC) signal, but the present disclosure is not limited to this. Referring to FIG. 3, in some other embodiments, the dimming voltage Vp may be an alternating current (AC) signal, and the peak voltages of the dimming voltage Vp correspond to each other (e.g., the peaks are +30V and −30V) to control the angle of the liquid crystal particles 121a in the polymer layer 121. The peak voltages of the dimming voltage Vp can be between 30V and 60V.

Figure 4:
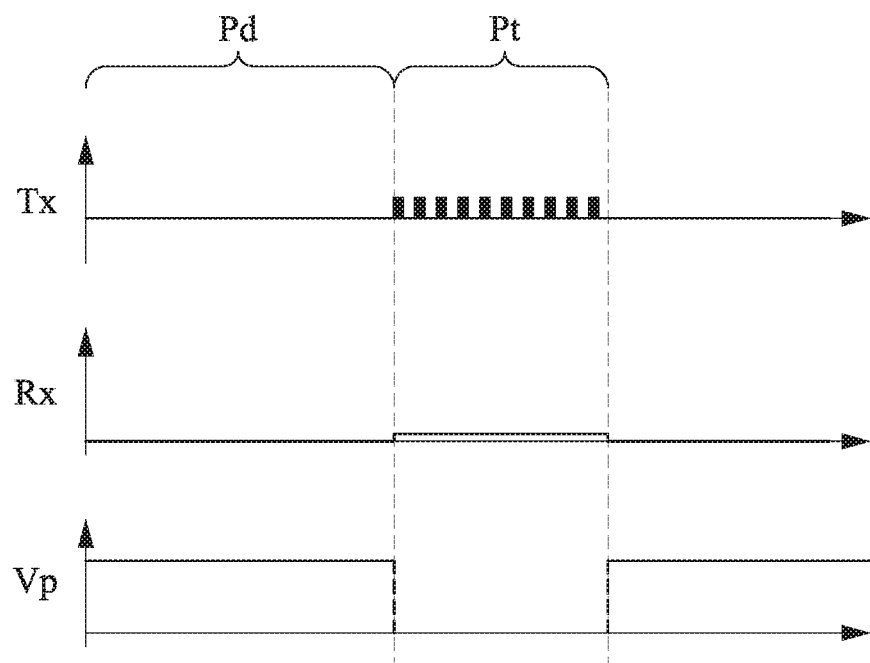
FIG. 4 is a waveform of the touch dimming device in some embodiments of the present disclosure.

Referring to FIG. 1 and FIG. 4, FIG. 4 is a waveform of the touch dimming device 100 in some embodiments of the present disclosure. In this embodiment, during the touch period Pt, the touch dimming device 100 operates in the first state; during the dimming period Pd, the touch dimming device 100 operates in the second state. In other words, during the dimming period Pd, the third electrode E3 receives the dimming voltage Vp, but the first electrode E1 and the second electrode E2 stop receiving the driving voltage Tx and the sensing voltage Rx. During this period (i.e., the dimming period Pd), the touch panel 110 will temporarily not perform touch detection, and the voltage difference between the dimming voltage Vp and the sensing voltage Rx is used for dimming operation.

Similarly, during another period (i.e., the touch period Pt), the third electrode E3 stops receiving the dimming voltage Vp, and the first electrode E1 and the second electrode E2 normally receive the driving voltage Tx and the sensing voltage Rx. At this time, the active color changing film 120 will maintain the light transmittance as when the active color changing film 120 is not electrically conductive.

In some embodiments, the operating state of the touch dimming device 100 (i.e., operating in the dimming period Pd or the touch period Pt) can be manually switched by the user. In some other embodiments, the touch dimming device 100 can also be switched between the first state (the touch period Pt) and the second state (the dimming period Pd) in sequence, and the time of the second state (the dimming period Pd) is much longer than the time of the first state (the touch period Pt). Accordingly, due to the impact of the persistence of vision, for the user, the active color changing film 120 still maintains a color changing state as when electrically conductive, and the touch dimming device 100 still has a touch detection function.

Figure 5:
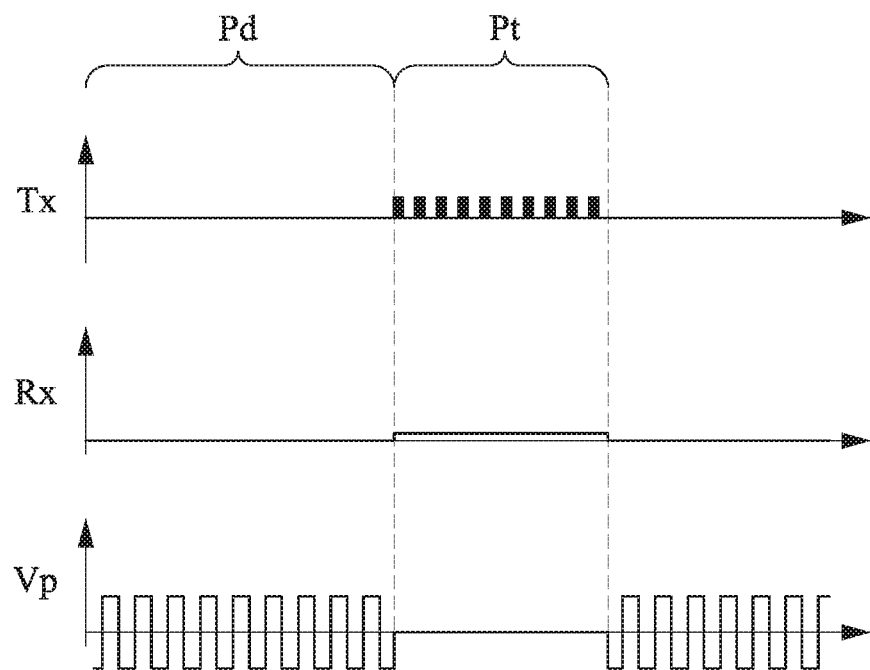
FIG. 5 is a waveform of the touch dimming device in some embodiments of the present disclosure.

In addition, as mentioned above, in some embodiments, the dimming voltage Vp may be an AC signal, and the peak voltages of the dimming voltage Vp correspond to each other, as shown in FIG. 5. The frequency of the dimming voltage Vp is between 100 Hz and 30,000 Hz.

Figure 6:
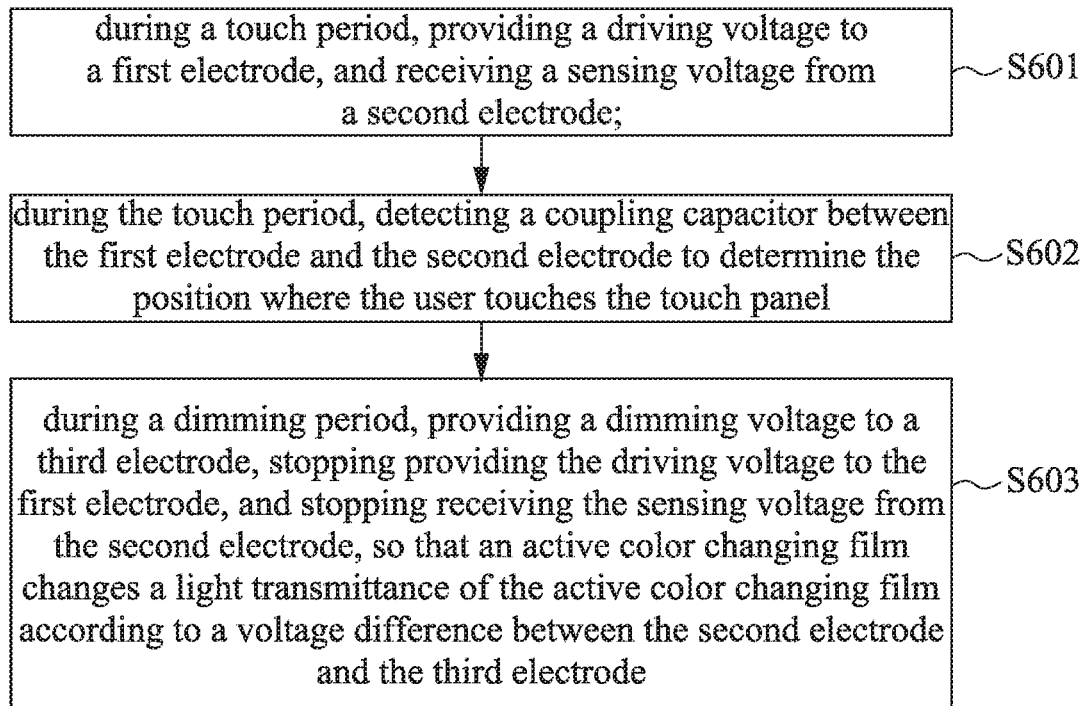
FIG. 6 is a flowchart diagram of a touch dimming method in some embodiments of the present disclosure.

Referring to FIG. 1 and FIG. 6, FIG. 6 is a flowchart diagram of the touch dimming method in some embodiments of the present disclosure. In step S601, during the touch period Pt, the control circuit 130 provides the driving voltage Tx to the first electrode E1 and receives the sensing voltage Rx from the second electrode E2. In step S602, during the touch period Pt, the control circuit 130 detects the coupling capacitance between the first electrode E1 and the second electrode E2 (e.g., detects the change of the sensing voltage Rx to determine the change of the capacitor value) to determine where the user touches the touch panel 110. At this time, the control circuit 130 does not provide voltage to the third electrode E3 (or the third electrode E3 is connected to ground).

In step S603, when operating in the dimming period Pd, the control circuit 130 provides the dimming voltage Vp to the third electrode E3, stops providing the driving voltage Tx to the first electrode E1, and stops receiving the sensing voltage Rx from the second electrode E2, so that the active color changing film 120 changes the light transmittance of the polymer layer 121 in the active color changing film 120 according to the voltage difference between the second electrode E2 and the third electrode E3.

The touch dimming method in FIG. 6 corresponds to the signal waveforms in FIG. 4 and FIG. 5. In some other embodiments, the operating state of the touch dimming device 100 may not be divided into different timings, so the touch dimming device 100 always maintains the touch function. In other words, as shown in FIG. 3, the touch dimming device 100 always provides the driving voltage Tx to the first electrode E1 and receives the sensing voltage Rx from the second electrode E2. When the touch dimming device 100 stops providing the dimming voltage Vp to the third electrode E3, the touch dimming device 100 still continuously provides the driving voltage Tx to the first electrode E1 and continuously receives the sensing voltage Rx from the second electrode E2.

Figure 7:
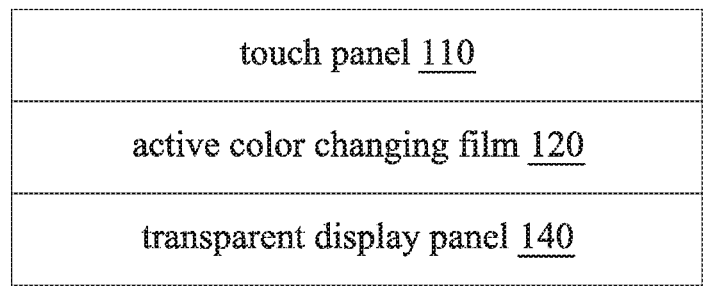
FIG. 7 is a schematic diagram of a touch dimming device in some embodiments of the present disclosure.

In the above embodiment, the touch dimming device 100 is combined with the transparent substrate (e.g., glass) for application in vehicle systems or other devices, but the present disclosure is not limited to this. FIG. 7 is a schematic diagram of a touch dimming device in some embodiments of the present disclosure. In this embodiment, the touch panel 110 and the active color changing film 120 are arranged on one side of a transparent display panel 140. The transparent display panel 140 is configured to receive a display signal to control multiple pixel units to present a display screen.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:
1. A touch dimming device, comprising:
  a touch panel comprising a first electrode and a second electrode, wherein:
    the touch panel is configured to perform touch detection according to a coupling capacitance between the first electrode and the second electrode,
    the first electrode is configured to receive a driving voltage, and
    the second electrode is configured to provide a sensing voltage; and
  an active color changing film comprising a third electrode and a polymer layer, wherein:
    the polymer layer is configured to change a light transmittance of the active color changing film according to a voltage difference between the second electrode and the third electrode,
    the active color changing film is configured to receive a dimming voltage through the third electrode,
    a ratio between the dimming voltage and the driving voltage is between 1.2-20.
2. The touch dimming device of claim 1, wherein in a first state, the third electrode receives the dimming voltage, the first electrode stops receiving the driving voltage, and the second electrode stops providing the sensing voltage; and in a second state, the third electrode stops receiving the dimming voltage, the first electrode receives the driving voltage, and the second electrode provides the sensing voltage.
3. The touch dimming device of claim 1, wherein the dimming voltage is an alternating current (AC) signal, and a frequency of the dimming voltage is between 100 Hz and 30,000 Hz.
4. The touch dimming device of claim 1, wherein the driving voltage comprises a plurality of scanning signals, and a frequency of the driving voltage is between 30 Hz and 1000 Hz.
5. The touch dimming device of claim 4, wherein a frequency of each of the plurality of scanning signals is between 10,000 Hz and 500,000 Hz.
6. The touch dimming device of claim 1, wherein the polymer layer comprises a plurality of liquid crystal par- ticles, and the plurality of liquid crystal particles are dispersed on a polymer film or distributed in a polymer network structure.

7. The touch dimming device of claim 1, comprising:
a transparent display panel arranged on a side of the active color changing film and configured to receive a display signal to present a display screen.

8. A touch dimming method, comprising:
during a touch period, providing a driving voltage to a first electrode and receiving a sensing voltage from a second electrode;
during the touch period, detecting a coupling capacitance between the first electrode and the second electrode; and
during a dimming period, providing a dimming voltage to a third electrode, stopping providing the driving voltage to the first electrode, and stopping receiving the sensing voltage from the second electrode, so that an active color changing film changes a light transmittance of the active color changing film according to a voltage difference between the second electrode and the third electrode.

9. The touch dimming method of claim 8, wherein the driving voltage comprises a plurality of scanning signals, a frequency of the driving voltage is between 30 Hz and 1000 Hz, and a frequency of each of the plurality of scanning signals is between 10,000 Hz and 500,000 Hz.

10. A touch dimming method, comprising:
providing a driving voltage to a first electrode and receiving a sensing voltage from a second electrode;
detecting a coupling capacitance between the first electrode and the second electrode;
providing a dimming voltage to a third electrode concurrently with providing the driving voltage to the first electrode, so that an active color changing film changes a light transmittance of the active color changing film according to a voltage difference between the second electrode and the third electrode; and
when stopping providing the dimming voltage to the third electrode, continuously providing the driving voltage to the first electrode and continuously receiving the sensing voltage from the second electrode.

11. The touch dimming method of claim 10, wherein the driving voltage comprises a plurality of scanning signals, a frequency of the driving voltage is between 30 Hz and 1000 Hz, and a frequency of each of the plurality of scanning signals is between 10,000 Hz and 500,000 Hz.

12. The touch dimming method of claim 10, wherein providing the dimming voltage comprises providing the dimming voltage at a constant value.

13. The touch dimming device of claim 7, wherein the active color changing film is between the touch panel and the transparent display panel.

14. The touch dimming device of claim 1, comprising:
a substrate, wherein a first surface of the first electrode is in contact with the substrate; and
an insulation layer, wherein:
a second surface of the first electrode and a first surface of the second electrode are in contact with the insulation layer, and
a second surface of the second electrode is in contact with a first surface of the polymer layer.

15. The touch dimming device of claim 14, wherein the third electrode is in contact with a second surface of the polymer layer.

16. The touch dimming device of claim 1, wherein a frequency of the dimming voltage is greater than a frequency of the driving voltage.

17. The touch dimming device of claim 1, wherein the dimming voltage is 30V-60V and the driving voltage is 3V-40V.

18. The touch dimming device of claim 1, wherein the dimming voltage is a direct current (DC) signal.

19. The touch dimming method of claim 8, comprising:
changing the sensing voltage between the touch period and the dimming period.

20. The touch dimming method of claim 8, wherein the third electrode is coupled to ground during the touch period.

* * * * *